United States Patent
Motika et al.

(10) Patent No.: US 10,930,364 B2
(45) Date of Patent: Feb. 23, 2021

(54) ITERATIVE FUNCTIONAL TEST EXERCISER RELOAD AND EXECUTION

(71) Applicant: International Business Machines Corporation, Armnk, NY (US)

(72) Inventors: Franco Motika, Hopewell Junction, NY (US); Gerard Salem, Essex Junction, VT (US); Mary Kusko, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/193,560

(22) Filed: Nov. 16, 2018

(65) Prior Publication Data

US 2020/0160932 A1    May 21, 2020

(51) Int. Cl.
  *G11C 29/38* (2006.01)
(52) U.S. Cl.
  CPC ................... *G11C 29/38* (2013.01)
(58) Field of Classification Search
  CPC ..................................... G11C 29/38
  See application file for complete search history.

(56) References Cited

U.S. PATENT DOCUMENTS

| | | | |
|---|---|---|---|
| 5,954,829 A | 9/1999 | McLain, Jr. et al. | |
| 6,539,497 B2 | 3/2003 | Swoboda et al. | |
| 6,772,326 B2 | 8/2004 | Chauvel et al. | |
| 6,789,172 B2 | 9/2004 | Chauvel et al. | |
| 6,914,834 B2 | 7/2005 | Mayer | |
| 7,451,366 B2 | 11/2008 | Youn et al. | |
| 7,761,717 B2* | 7/2010 | Moller | G06F 21/79 380/255 |
| 2003/0023914 A1 | 1/2003 | Taylor et al. | |
| 2009/0076747 A1* | 3/2009 | Lee | G01R 31/2844 702/58 |
| 2009/0100305 A1 | 4/2009 | Jan et al. | |

(Continued)

OTHER PUBLICATIONS

Disclosed Anonymously, "An Innovative Approach of Test Time Reduction for Core Exposed Mode Pattern on ATE", IP.com IPCOM000224597D, Jan. 3, 2013, 7 pgs.

(Continued)

*Primary Examiner* — Thien Nguyen
(74) *Attorney, Agent, or Firm* — Cantor Colburn LLP; Steven Chiu

(57) ABSTRACT

Methods, systems and computer program products for loading, storing and executing dynamically modifiable functional exercisers are provided. Aspects also include receiving a plurality of functional exercisers by a secondary reload memory disposed on a device-under-test. Aspects include loading at least a first functional exerciser from the secondary reload memory into a primary execution memory disposed on the device-under-test. Aspects include executing and modifying the first functional exerciser stored in the primary execution memory. Aspects further include, responsive to determining based on a test algorithm that one or more functional exercisers of the plurality have not been fully executed, loading a second functional exerciser from the secondary reload memory into the primary execution memory.

20 Claims, 3 Drawing Sheets

(56) References Cited

U.S. PATENT DOCUMENTS

| | | | |
|---|---|---|---|
| 2009/0158101 A1* | 6/2009 | Abu-Rahma | G11C 8/08 714/701 |
| 2013/0018624 A1* | 1/2013 | Bhatnagar | G01R 31/58 702/119 |
| 2013/0019126 A1* | 1/2013 | Frohlich | G06F 11/3688 714/38.1 |
| 2015/0074459 A1* | 3/2015 | Hong | G01R 31/31813 714/30 |
| 2015/0377961 A1* | 12/2015 | Lin | G06F 11/263 714/724 |
| 2017/0343601 A1* | 11/2017 | Casatuta | G01R 31/31707 |
| 2017/0371771 A1* | 12/2017 | Bosko | G06F 11/3668 |

OTHER PUBLICATIONS

Disclosed Anonymously, "Method for verifying intermediate results of a randomly generated testcase of Processor Functional Validation Exerciser.", IP.com IPCOM000243758D, Oct. 16, 2015, 10 pgs.

Vivek Motwani, "The When & How of Test Automation", QAI India Ltd, 3rd Annual International Software Testing Conference, 2001, India, 12 pgs.

* cited by examiner

ITERATIVE FUNCTIONAL TEST EXERCISER RELOAD AND EXECUTION

BACKGROUND

The present invention generally relates in general to the field of integrated circuits, and more specifically, systems and methodologies for the functional testing of complex functional integrated devices.

There is an increased desire for manufacturers, developers, and test organizations to effectively test, characterize, and diagnose complex functional integrated devices more completely and at the lowest possible cost. Such complex functional integrated devices may include multi-core processors with large amounts of integrated random-access memory (RAM) and dynamic random-access memory (DRAM), diverse analog circuits, multiple input/output (I/O) buses, phase-locked loops (PLLs), digital phase-locked loops (DPLLs) and other custom designs. Due to the complexity of such devices, a frequently encountered problem in functionally testing, characterizing and diagnosing large and complex functional devices is conditional and dynamic test adaptability resulting in excessive test execution time and associated large test data size, which generally raises the cost and decreases the effectiveness of testing.

SUMMARY

Embodiments of the present invention are directed to a computer-implemented method for loading, storing and executing dynamically modifiable test patterns by a device-under-test. A non-limiting example of the computer-implemented method includes receiving, by a secondary reload memory, a plurality of functional exercisers. The secondary reload memory being disposed on a device-under-test. The method includes loading, from the secondary reload memory and into a primary execution memory, at least a first functional exerciser of the one or more functional exercisers. The primary execution memory being disposed on the device-under-test. The method includes executing, by a processor, the first functional exerciser stored in the primary execution memory. The processor is disposed on the device-under-test. Responsive to determining, by the processor based on a test algorithm, that one or more functional exercisers of the plurality of functional exercisers have not been fully executed, the method further includes loading a second functional exerciser of the one or more functional exercisers from the secondary reload memory into the primary execution memory.

Embodiments of the present invention are directed to a system for loading, storing and executing dynamically modifiable test patterns by a device-under-test. The system includes an automated test equipment device that is communicatively coupled to a device-under-test. The device-under-test includes a memory having computer readable computer instructions, and a processor for executing the computer readable instructions. The memory includes a primary execution memory and a secondary reload memory. The computer readable instructions include instructions for receiving, by the secondary reload memory, a plurality of functional exercisers. The computer readable instructions also include instructions for loading, from the secondary reload memory and into the primary execution memory, at least a first functional exerciser of the plurality of functional exercisers. The computer readable instructions also include instructions for modifying and executing the first functional exerciser stored in the primary execution memory. Responsive to determining, based on a test algorithm, that one or more functional exercisers of the plurality of functional exercisers have not been fully executed, the computer readable instructions include instructions for loading a second functional exerciser of the one or more functional exercisers from the secondary reload memory into the primary execution memory.

Embodiments of the invention are directed to a computer program product for loading, storing and executing dynamically modifiable test patterns by a device-under-test, the computer program product comprising a computer readable storage medium having program instructions embodied therewith. The computer readable storage medium is not a transitory signal per se. The program instructions are executable by a processor to cause the processor to perform a method. A non-limiting example of the method includes receiving, by a secondary reload memory, a plurality of functional exercisers. The secondary reload memory being disposed on a device-under-test. The method includes loading, from the secondary reload memory and into a primary execution memory, at least a first functional exerciser of the one or more functional exercisers. The primary execution memory being disposed on the device-under-test. The method includes modifying and executing, by a processor, the first functional exerciser stored in the primary execution memory. The processor is disposed on the device-under-test. Responsive to determining, by the processor based on a test algorithm, that one or more functional exercisers of the plurality of functional exercisers have not been fully executed, the method further includes loading a second functional exerciser of the one or more functional exercisers from the secondary reload memory into the primary execution memory.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
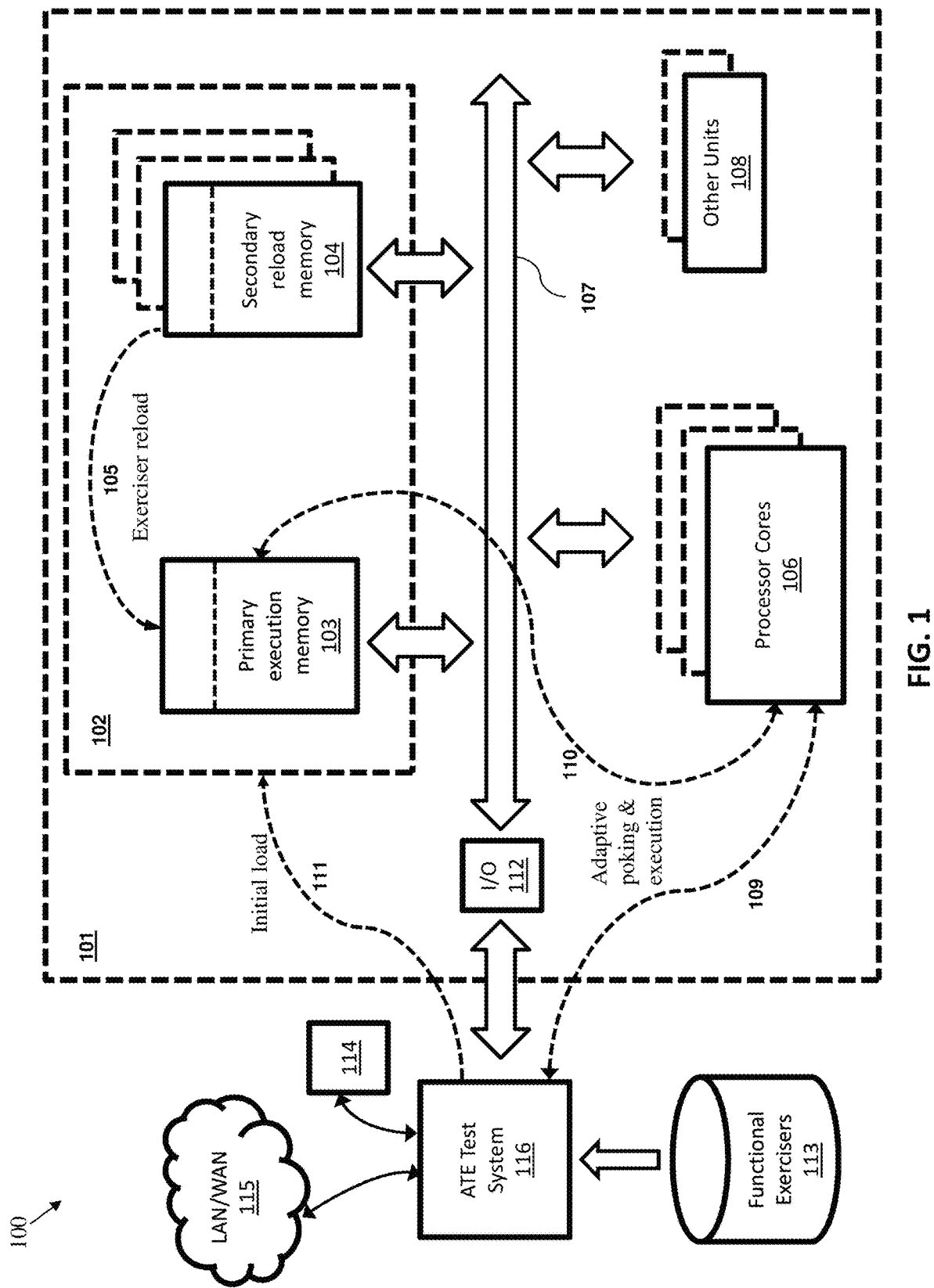
FIG. 1 depicts a block diagram presenting an overview of an embodiment.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Additionally, although this disclosure includes a detailed description of a computing device configuration, implementation of the teachings recited herein at not limited to a particular type or configuration of computing device(s). Rather, embodiments of the present disclosure are capable of being implemented in conjunction with any other type or configuration of wireless or non-wireless computing devices and/or computing environments, now known or later developed.

Conventional functional testing may be carried out by an automatic test equipment (ATE) test system that loads exercisers onto a test device, issues commands to run the exercisers and flags errors when they occur. However, if one of the exercisers fails, it would be necessary to reload and restart the test from the beginning, which typically requires reloading the entire exerciser from the ATE test system, which is very time consuming. Thus, functionally testing, characterizing and diagnosing large and complex functional devices by conventional methods generally results in excessive test execution time and an associated large test data size. There are many factors that can contribute to these very long test times of today's large functional integrated devices. For example, although many devices' test methodology is based on design-for-test (DFT) that aids in reducing test time, additional external test time contributors can include: complex functional exercisers (such as power-on-exerciser (POE, trash), etc.), a need to reload and restart the test after failure (check stop, parity errors, etc.), extensive characterization test sequences (shmoos, min/max searches, etc.), adaptive and conditional configuration setups (partial good, adaptive repairs, etc.), and diagnostic search resolution (intermittent fails, noise evaluation, multiple large unloads, and other iterative diagnostic tests). The cumulative impact of these above test processes on expensive ATE test systems generally results in long test turn-around-time, which negatively impacts overall design development, system bring-up and manufacturing test costs.

Embodiments disclosed herein propose a solution to these problems that involves partitioning the integrated memory on the device into a primary execution memory and one or more equivalent secondary memory(s) to be used as a restore area of the original functional exerciser test instructions and data. Such "memories" may also be referred to herein as "buffers" or "areas." The functional exerciser can be executed or run from the primary area and when the test needs to be restarted or restored the original or modified functional exerciser can be executed or run from one of the secondary area(s). In contrast to loading an exerciser from an ATE test system, which is very slow, loading/reloading exercisers from the secondary area/memory of the device can be reloaded at the speed of the device, which is usually significantly faster. As will be appreciated by those of skill in the art, functional tests may be run hundreds of times, meaning that significant time savings can be realized by the disclosed systems and methods.

According to some embodiments, the primary and secondary storage areas can be an integral part of the device, but do not need to necessarily be of the same storage level or type, for example SRAM or DRAM. These storage areas or buffers may either be part of the mission memory or test support specific memory of the device-under-test ("DUT").

In some embodiments, the test patterns and/or exercisers that have been loaded into the primary storage area can be dynamically and iteratively altered prior to each test pass of conditional or adaptive tests execution and as required by characterization and diagnostics test sequences. For example, a test algorithm (which may also be referred to as a control algorithm) executed by a controller of the DUT may determine whether to modify or poke test patterns/exercisers, change condition set points, and/or re-run tests.

In some embodiments, the primary area may also be loaded with one or more functional exercisers and test support functions. According to some embodiments, a functional exerciser may be a set of instructions that are loaded and executed by the system to perform functions in various parts of the device (i.e., "exercise the device"), for example over a wide range of voltages and frequencies to determine operating ranges of the device. While conventional functional exercisers may be considered to run on in a full environment (e.g., a full operating system), functional exercisers as disclosed herein may refer to custom functional exercisers configured to be run on a custom integrated circuit (IC) chip that is supported by a design-for-test (DFT) functionality.

Embodiments of the present disclosure provide the benefits that relatively large exerciser(s) need only be loaded into the DUT memory only once from an externally slow test system (e.g., an external ATE test system). Then these functional exerciser(s) can be interactively and iteratively modified prior to each execution of the functional exerciser(s) at a much greater speed than if such modifications were loaded from the external test system. The present disclosure presents several improvements to conventional testing systems, including a primary and secondary embedded memory space design that allows reload and/or modification of test sections (e.g., test patterns, functional exercisers) for reuse in multiple test execution passes, dynamically and conditionally modifiable test(s) in the executable memory that allow for poking (i.e., modifying one or more instructions of a functional exerciser), edit command, instructions and data, conditional branching execution, restore test exerciser after fail corruption (i.e., primary executable memory section re-initialization via reload from secondary memory buffer), and tightly coupled test sequence execution and data analysis in conjunction with an external ATE.

With reference to FIG. 1, a block diagram presenting an overview of an embodiment is presented. FIG. 1 illustrates a functional test system configuration 100 that can be used to test a device-under-test ("DUT") 101. According to some embodiments, a DUT 101 may be a chip, an integrated circuit, a wafer, a module or an end system. As shown, the DUT 101 can be communicatively connected to an automated test equipment ("ATE") test system 116 that can provide the DUT 101 with an initial load of functional exercisers to be stored by the DUT 101 for future execution. As will be understood of those of skill in the art, the ATE test system 116 can include associated instrumentation and environmental controls. In some embodiments, the ATE system 116 could include a simple test exerciser, such as a Design Verification based Stand-Alone (SA) exerciser system.

According to some embodiments, DUT 101 may include a DUT integrated test memory sub-system 102 for loading functional exercisers and/or test patterns to be run by a processor of the DUT 101. The DUT integrated test memory sub-system 102 can include a primary execution memory 103 and a secondary reload memory 104. According to some embodiments, the primary execution memory 103 can act as the storage for the active test exerciser. In some embodiments, adaptive modification and dynamic updates of the exerciser can be performed in the primary execution memory 103 prior to the next test run. According to some embodiment, dynamic updates of the exerciser can be performed during execution of the exerciser.

In some embodiments, the secondary reload memory 104 can be configured to load/reload 105 functional exerciser(s) from the secondary reload memory 104 into the primary execution memory 103. For example, the secondary reload memory 104 may perform an initial load of the test exerciser(s) and associated support exerciser subroutine(s), and may reload and/or restore such test exerciser(s) and subroutine(s) into the primary execution memory 103 as required. According to some embodiments, the secondary reload memory 104 can be initially loaded (i.e., receiving functional exercisers, test patterns, associated subroutine(s), etc.) from the external ATE test system 116. In many cases, the initial loading of the secondary reload memory 104 from the external ATE test system 116 may typically only need to occur one time. For example, a communication link 111 between the ATE test system 116 and the DUT integrated test memory sub-system 102 can provide the support to initially set up and load the exercisers into the secondary reload memory 104. Storing multiple exercisers in the secondary reload memory 104 allows the DUT 101 to avoid having to repeatedly load the new exercisers from the ATE test system 116 through chip pins of the ATE system 116, which is slow and delays ongoing testing. In some embodiments, the secondary reload memory 104 can maintain its initially loaded contents throughout the exerciser execution.

In some embodiments, the primary execution memory 103 and the secondary reload memory 104 may be integral to the DUT 101. In some embodiments, the primary execution memory 103 and the secondary reload memory 104 may be formed from a single memory device that has been partitioned. According to some embodiments, the primary execution memory 103 and the secondary reload memory 104 may be of different types of memory, for example, one may be SRAM and the other may be DRAM, and/or they may be different sizes of memory. According to some embodiments, the secondary reload memory 104 may be larger than the primary execution memory 103.

As shown in FIG. 1, the DUT 101 may also include processor core(s) 106, other unit(s) 108 and an input/output (I/O) interface 112 that may communicate with one another and the DUT integrated test memory sub-system 102 via a bus 107. According to some embodiments, bus 107 can be a generic inter-chip data transfer bus between the DUT 101 processors (e.g., processor core(s) 106), memory (DUT integrated test memory sub-system 102) and other functional units (e.g., other units 108) or chiplets. According to some embodiments, processor core(s) 106 can be one or more imbedded processor cores that include the test exerciser(s) dynamic edits (i.e., modifying/updating an exerciser in the primary execution memory 103 prior to a next test run) support and eventual condition execution, in accordance with a test algorithm. In other words, in addition to modification of a test pattern/exerciser, conditions (e.g., voltage, clock frequency, etc.) of the test may also be altered. In some embodiments, one or more processor core(s) 106 may act as a test sequence controller that executes the test algorithm. According to various embodiments, different DUT 101 functional designs may include of one or a multitude of processors or controllers loaded with specific microcode to support the functional test. A communication link 110 between the processor core(s) 106 and the primary execution memory 103 can support the dynamic update of the exerciser in the primary execution memory 103 and control the adaptive sequencing during execution of the exerciser(s). According to some embodiments, the communication link 110 can be a tightly coupled link executing functional test specific microcode. In some embodiments, a system being tightly coupled may mean that the system has a shared memory, as opposed to a distributed memory. Other unit(s) 108 represent all other functional units that may be considered during the functional test, such as for example but not limited to sub-functional chiplets. The I/O interface 112 provides an interface between the ATE test system 116 and the DUT 101. In various embodiments, the I/O interface 112 may take various forms, such as for example but not limited to, a simple slow serial interface, a wide broadside bus, or high speed optical links.

According to some embodiments, the I/O interface 112 may facilitate a communication link 109 between the ATE test system 116 and the processor core(s) 106 to setup, initiate, control, and sequence the functional test exercisers. This control can occur before, during and at the end of the test exerciser execution. The communication link 109 can be used to coordinate and synchronize communication between the DUT 101 and external instrumentation. For example, DUT 101 may be configured to dynamically request some functionality (e.g., an external temperature change) from the ATE test system 116.

In some embodiments, the DUT 101 may include a test sequence controller ("controller") that may be a test specific processor (e.g., a processor core 106) that can be configured to control the execution of the tests. In some embodiments, the controller may execute a test algorithm that is configured to dynamically modify a test pattern or exerciser stored in the primary execution memory 103 and/or the secondary reload memory 104 in response to, for example, a determination of the existence of a device failure or a determination of that a condition has been passed or failed. For example, if an exerciser is executing at a first speed and the execution of the exerciser fails, the clock speed could be lowered to see if the device would now pass. In another example, a test may involve multiple processor cores 106, but the system may determine that one of the processor cores 106 has failed, and so the algorithm may dictate that the exerciser be modified to exclude the failed processor core 106 from the next test run and may cause the exerciser to be reloaded into the primary execution memory 103. Other conditions that may cause the controller to restore or reload an exerciser may include a parity fail, a check stop, logic errors, or other such conditions indicating that a portion of the device has failed or malfunctioned. In some embodiments, the controller and test algorithm may allow the system to utilize a conditional and adaptive exercise flow. For example, if a failure is detected at a certain condition (e.g., temperature, voltage), then the controller may change the condition to a different test point (e.g., change the temperature at which the test is run at), where the new test point of the condition may be determined by the algorithm. According to some embodiments, the controller interface may be tightly coupled with the ATE test system 116, such that the controller may communicate with the ATE test system 116 to make requests for functions that are not supported by the DUT 101, such as for example, loading exercisers, requests for test specific environment changes, results analysis and conditional test execution, and the like. According to some embodiments, such requests may be made dynamically during execution of exercisers or between exerciser runs, as dictated by the test algorithm executed by the controller, for example, based on test observations of previous tests.

As shown in FIG. 1, the ATE test system 116 can communicate with a functional exerciser storage 113, which may be a disk drive or any other suitable storage medium representing a high capacity pattern storage sub-system of the ATE test system 116. Patterns and functional exercisers can be transferred from the high capacity storage housing functional exerciser storage 113 to the ATE test system's 116 pattern storage memory and then eventually transferred to the DUT secondary reload memory 104 as required by the specified functional exerciser. According to some embodiments, a functional exerciser can be a subset of a pattern. ATE test system 116 may also be communicatively connected to a user input terminal 114. The user input terminal 114 may provide a device that can allow a user, such as a system engineer, to input instructions to the ATE test system 116 and may include, for example, a display, a user interface, a keyboard, a mouse, and any other such devices or features that may allow a user to view data output by the ATE test system 116 and input commands or other instructions to the ATE test system 116. According to some embodiments, the ATE test system can also be connected (wirelessly or via a wired connection) to a network 115, such as a local area network (LAN) or a wireless area network (WAN), which may provide remote access to and from the ATE test system 116. Accordingly, in some embodiments, a user may access the ATE test system 116 in a manner similar to user input terminal, but using a remote computing device (e.g., a desktop, a laptop, a tablet, a smartphone or the like) via network 115. The network 115 may be one or more of, or a combination of, public (e.g., Internet), private (e.g., local area network, wide area network, virtual private network), and may include wireless and wireline transmission systems (e.g., satellite, cellular network, terrestrial networks, etc.).

It should be understood that in various embodiments, the implementation of an integrated functional test exerciser as described herein may depend on the test system capabilities and on the Design-for-test (DFT) support or Built-in-self-test (BIST) on the DUT 101. According to some embodiments, the system may include one or more typical ATE test system capabilities such as: environmental controls, DUT alignment and contacting sub-system, power supply capacity, full digital I/O complement, clocks and I/O timing programmability, parametric test I/O channels, analog instrumentation, microcode support, product test interface, part number program (PNP) software support for DUT interactive test. In general, according to embodiments of the present disclosure, the test system (e.g., ATE test system 116) may be capable of setting up test conditions and to support the DUT's 101 interactive built-in test execution requirements. Similarly, according to some embodiments, some of the features of the DUT built-in support may include: primary and secondary storage buffer allocation and associated microcode, integrated microprocessor or test controller and associated microcode, exerciser test sequence control, pass/fail analysis and flow decision, interactive tester protocol, and test system I/O interface bus. In some embodiments, the configuration of FIG. 1 may be implemented in a system that includes extensive DFT support for: integrated test sequencer, primary and secondary memory support, and ATE protocol and I/O interface. Alternate embodiments may utilize partitions of existing memory for the primary and secondary storage areas. If a built-in controller or microprocessor is available, it may also be used for test sequencing control. In some embodiments, such implementations may require additional extensive ATE support.

Figure 2:
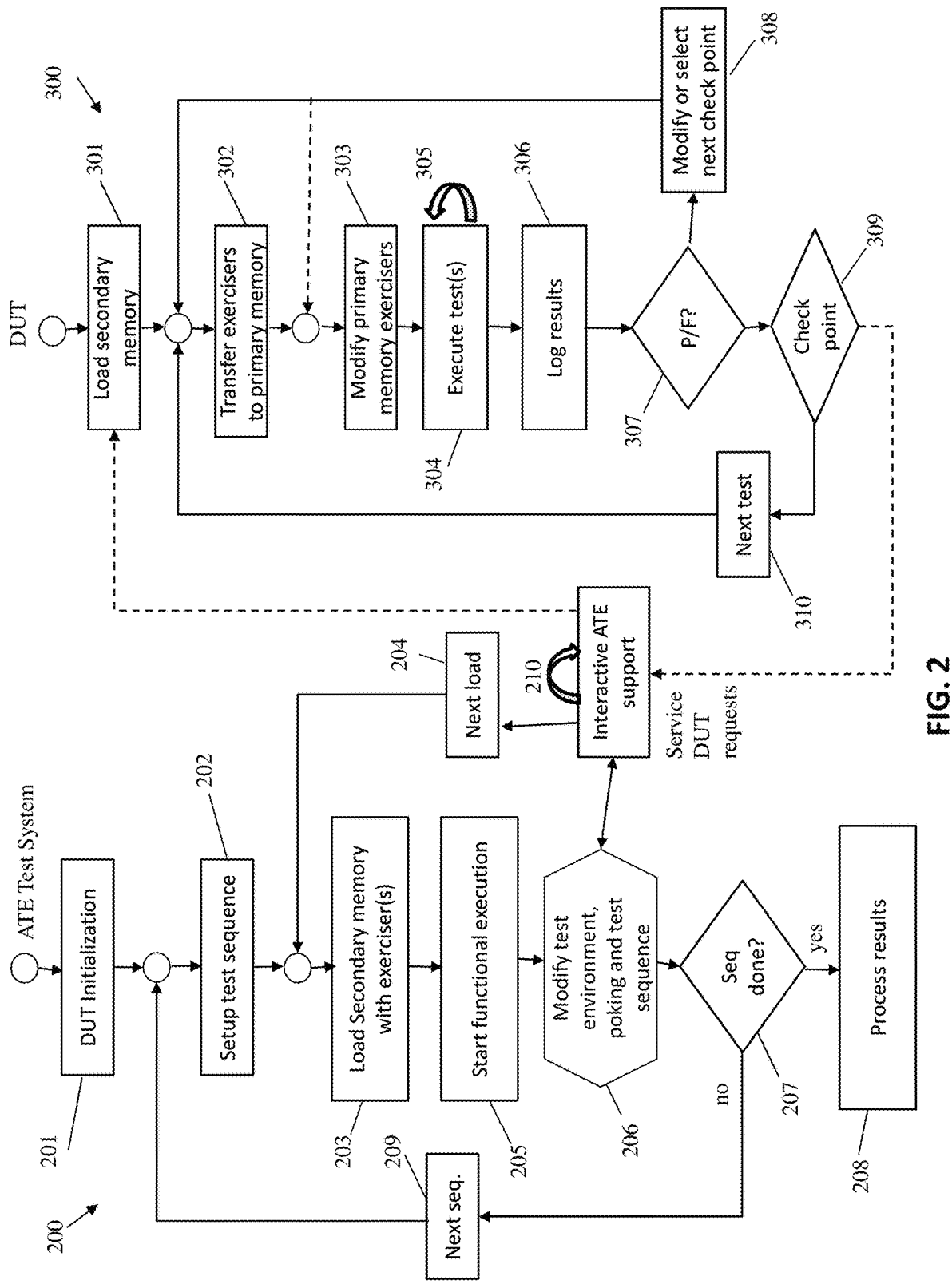
FIG. 2 depicts a flow diagram illustrating the operation of an embodiment.

Turning now to FIG. 2, a flow diagram of a method 200 for the test system's part number program (PNP) execution process in accordance with an embodiment is shown. A PNP execution can be a set of patterns that may or may not include a functional exerciser that are used to test a device, where the part number may be the chip or the product to be tested. FIG. 2 also shows a flow diagram of a method 300 for loading, storing and executing dynamically modifiable functional exercisers and/or test patterns by the DUT 101 in accordance with an embodiment. Methods 200 and/or 300 can be employed in many different embodiments or example not specifically depicted or described herein. In some embodiments, the procedures, processes, and/or activities of methods 200 and/or 300 can be performed in the order presented. In other embodiments, the procedures, processes, and/or activities of methods 200 and/or 300 can be performed in any other suitable order. In still other embodiments, one or more of the procedures, processes, and/or activities of methods 200 and/or 300 can be combined with additional steps or skipped steps. In one or more embodiments of the present invention, the methods 200 and 300 may be embodied by elements of the functional test system configuration 100 of FIG. 1. For example, according to some embodiments, the blocks numbered in the 200's can be executed by the ATE test system 116 (including functional exerciser storage 113 and user input terminal 114 as necessary), and the blocks numbered in the 300's can be executed by the DUT 101. In one or more embodiments of the present invention, the methods 200 and/or 300 may be embodied by software and/or computer elements residing on a computer system or processing system, such as the processing system 300 described herein below and illustrated in FIG. 3, or in some other type of computing or processing environment.

Method 200 starts at block 201, where the DUT 101 is initialized prior to the executing the functional test. In some embodiments, the DUT 101 can be an integrated circuit (IC) chip, a wafer, a module or an end system. Initializing the DUT 101 may include specifying several environmental parameters such as temperature, power supplies setup, I/O pin setup, timing and clock selection, and the like. This step may further include executing basic verification tests to ensure the device is capable of running follow-on interactive functional tests. For example, this may include a power-on DUT and/or chip initialization.

At block 202, the method 200 includes initializing the test sequence. A test sequence can be a sequence of functional exercisers to be run to test portions of the DUT 101. According to some embodiments, initializing the test sequence can include determining a plurality of functional exercisers to be tested. Generally, many tests are run in sequentially to ensure proper test coverage. According to some embodiments, these tests may include functional exercisers, structural, parametric and analog tests. Additional characterization and specific diagnostic tests may also be part of the overall manufacturing or engineering sequence.

At block 203, the method 200 includes loading the desired exercisers and support patterns into the secondary reload memory 104 of the DUT 101. According to some embodiments, multiple exercisers can be loaded at once, depending on the amount of memory available in the secondary reload memory 104 of the DUT 101 and the combined size of the exercisers. As will be appreciated by those of skill in the art, different exercisers may exercise different portions of the DUT 101.

At block 204, the method 200 includes receiving a next load request. According to some embodiments, a next load request can be generated by the DUT 101 interactively during functional test execution. In some embodiments, the DUT 101 may generate a next load request at the end of a test sequence or when another text exerciser or support is required. For example, conditional or adaptive test results or diagnostic and characterization sequence may require special support exercisers not initially loaded in the primary execution memory 103 or secondary reload memory 104 of the DUT 101.

At block 205, the method 200 includes starting the functional exerciser execution. In some embodiments, starting the functional exerciser execution includes setting up and initiating the DUT clocking sequence and starting test execution.

At block 206, the method 200 includes modifying the test environment, poking and/or modifying the exerciser and test sequence. According to some embodiments, "poking" may refer to in situ modification of a pattern and/or exerciser data. In some embodiments, modifying or poking the test environment and test sequence can be based on interactive execution control between the tester (i.e., ATE test system 116) and the DUT (e.g., a microprocessor) or test controller. In some embodiments, modifying the test environment and poking the test sequence may include dynamically editing or poking the DUT loaded exerciser from the test system (e.g., ATE test system 116). In some embodiments, the poking function may be similar to the poking by the integrated microprocessor or test controller, but may be executed by the test system (e.g., ATE test system 116). In some embodiments, modifications to the test environment can include one or more of changing the temperature of the DUT 101, the input voltage of the DUT 101, or other such environmental factors.

At block 207, the method 200 includes determining if all the test sequences are complete or if the next sequence needs to be initiated. If the system determines that all of the test sequences are complete, then the method may proceed to block 208 where the results of the test(s) are processed, desired data is saved and the testing in the PNP flow is terminated. In some embodiments, the results can be characterized and the DUT 101 may be diagnosed to identify any issues (e.g., pass/fail data, repair data, etc.). If the system determines that all of the test sequences are not complete, the method may proceed to block 209, which includes setting up and initiating the next test sequence that was determined at block 207.

At block 210, the method 200 includes receiving an interactive test system support request from the DUT 101. For example, the interactive test system support request may include a request to start execution, load exercisers, request for test specific environmental changes, results analysis and conditional test execution, adaptive test support not supported by the DUT 101 controller (e.g., microprocessor or test controller), or other such requests. In response to receiving an interactive test system support request from the DUT 101, the system may generate and execute an instruction to execute the support request by, for example, generating a next load request to load the secondary reload memory with exercisers at block 203 or to generate a modification request to modify the test environment, pattern poking, exerciser poking and/or test sequence at block 206.

Method 300 starts at block 301, where the method includes loading the secondary reload memory 104 of the DUT 101 with one or more exercisers and associated support patterns and/or instruction sequences. As described previously above, the secondary reload memory 104 can load the one or more exercisers and associated support patterns and/or instruction sequences from the ATE test system 116. This step may be typically carried out once per test exerciser depending on the storage capacity of the secondary reload memory 104.

At block 302, the method 300 includes transferring selected one or more exercisers from the secondary reload memory 104 to the primary execution memory 103, for example, in accordance with a test algorithm executed by the controller of the DUT 101. At block 303, the method 300 includes updating one or more test exercisers by modifying and/or poking the one or more exercisers in the primary execution memory 103 prior to the execution of the one or more exercisers, for example, as dictated by the test algorithm. According to some embodiments, modifying and/or poking the exercisers can occur initially after the transfer from the secondary reload memory 104, or dynamically by the processor during execution. According to some embodiments, a determination to modify and/or poke the exercisers can be based on the results of the current test or of the tests of other devices.

According to some embodiments, a new exerciser may be loaded into the primary execution memory 103 or a current exerciser presently loaded in the primary execution memory 103 may be modified prior the next execution of a functional test. In this way, the system may iteratively and dynamically modify a test pattern and/or exerciser in the primary execution memory 103 or the secondary reload memory 104.

At block 304, the method 300 includes executing the updated test exerciser(s). Alternatively, if the test exerciser is being run for the first time, the method may include executing a version of the exerciser that has not been updated. In some embodiments, execution of the updated test exerciser(s) may include running the test exerciser multiple times until a pass/fail condition occurs. For example, multiple runs of the test exerciser may often be required when searching for a fail condition such as searching for a minimum voltage or executing binary search routines. Accordingly, in some embodiments, executing the updated test exerciser(s) may include recursively executing 305 one or more test exercisers until a pass/fail condition is met.

At block 306, the method 300 includes logging diagnostic and characterization results. For example, in some embodiments, diagnostic and characterization results can be logged during each test execution pass and stored for future analysis. According to some embodiments, some of the results can be used to determine adaptive and conditional test sequence decisions. Some of the results acquisition can occur concurrently while the test is executing by both the DUT 101 controller (e.g., microprocessor controller) and/or the test system (e.g., ATE test system 116).

At block 307, the method 300 includes determining the whether the previously executed test passed or failed and if execution terminates or continues at the next condition. Based on one or more iterative test executions at block 304 and the results logged at block 306, the controller can determine if the test has passed or failed a given test condition and may determine whether the execution of the current exerciser should terminate (proceed to block 309) or whether current exerciser should be modified or reloaded for another execution (proceed to block 308). For example, the test algorithm may call for executing the same exerciser at various temperature conditions, and if all of the temperature conditions have been tested, then the controller may decide to either modify the current exerciser (at block 308) or terminate continued execution of the current exerciser (at block 309), whereas if there are temperature conditions at which the exerciser has not yet been tested, the controller may determine (at block 308) that a new set point for the temperature condition be set, and may reload the exerciser to be run again and/or load data (e.g., representing the new condition check point) from the secondary reload memory 104 into the primary execution memory 103. According to some embodiments, the method may proceed to block 308 in response to either a pass or a fail condition being detected at block 307, based on the instructions provided by the test algorithm or the PNP execution process. In other words, in some cases, a fail condition may cause the method to proceed to block 308 and in other cases a fail condition may cause the method to proceed to block 309, and vice-versa with respect to a pass condition.

At block 308, the method 300 includes determining whether to modify the exerciser(s) in primary execution memory 103 (i.e., proceed to step 303) or to transfer data from the secondary reload memory 104 (i.e., proceed to step 302) to the primary execution memory 103. For example, data representing a new set point of a condition to run the exerciser at (such as a new temperature) may be loaded from the secondary reload memory 104 to the primary execution memory 103. Such determinations may be based on whether the previous execution of the exerciser passed or failed at specified condition.

At block 309, the method 300 includes determining if DUT testing is complete or whether to execute the next exerciser in the primary execution memory 103. If the system determines to execute the next exerciser in the primary execution memory 103, the method proceeds to block 310 in which includes initiating the next exerciser test. If the system determines that DUT testing is complete, the method may invoke requests for ATE system (e.g., ATE test system 116) support.

Additional processes may also be included. It should be understood that the processes depicted in FIG. 2 represent illustrations, and that other processes may be added or existing processes may be removed, modified, or rearranged without departing from the scope and spirit of the present disclosure.

Figure 3:
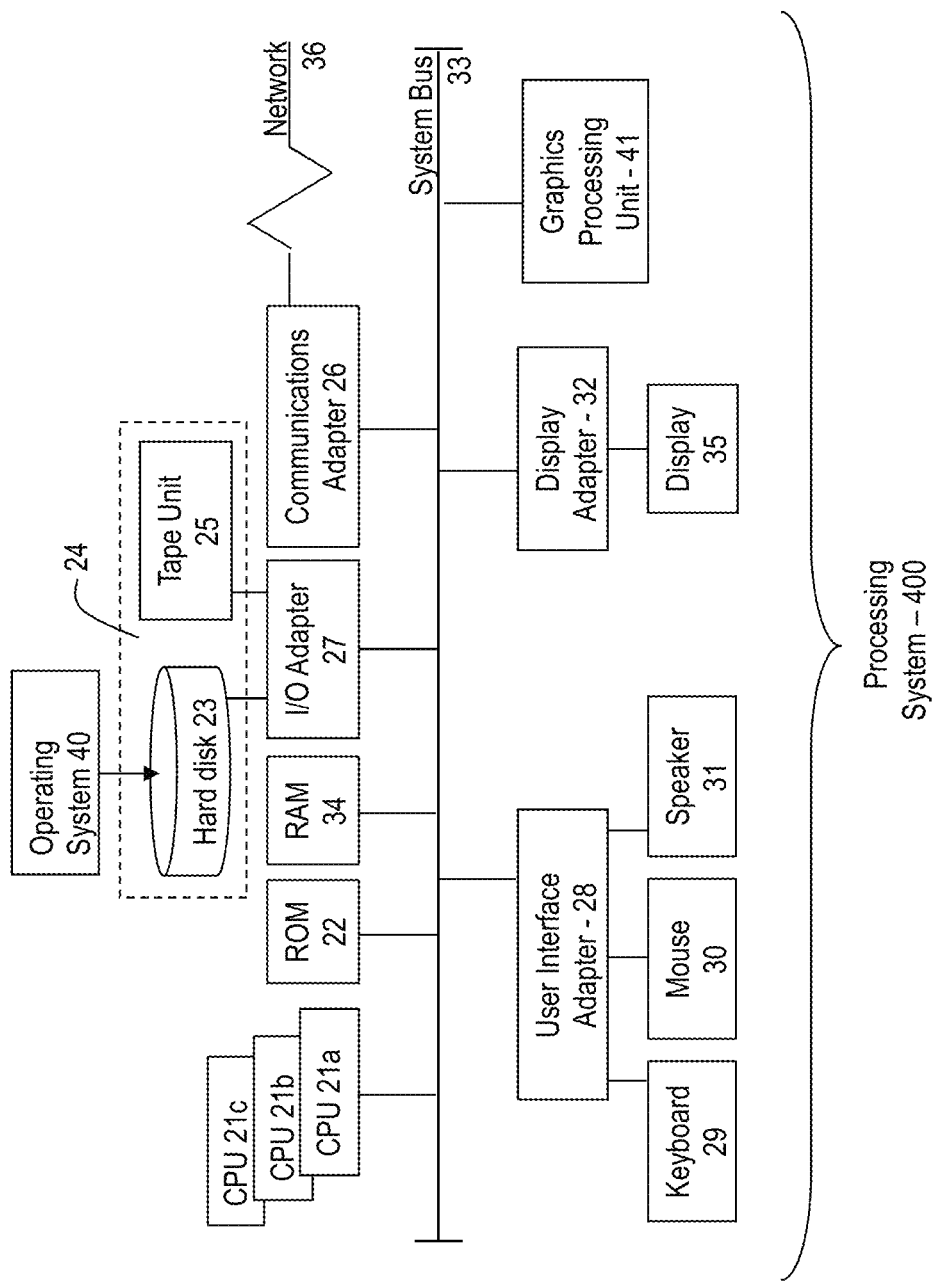
FIG. 3 depicts a block diagram of a computer system for use in implementing one or more embodiments of the present invention.

Referring to FIG. 3, there is shown an embodiment of a processing system 400 for implementing the teachings herein. In this embodiment, the system 400 has one or more central processing units (processors) 21a, 21b, 21c, etc. (collectively or generically referred to as processor(s) 21). In one or more embodiments, each processor 21 may include a reduced instruction set computer (RISC) microprocessor. Processors 21 are coupled to system memory 34 and various other components via a system bus 33. Read only memory (ROM) 22 is coupled to the system bus 33 and may include a basic input/output system (BIOS), which controls certain basic functions of system 400.

FIG. 3 further depicts an input/output (I/O) adapter 27 and a network adapter 26 coupled to the system bus 33. I/O adapter 27 may be a small computer system interface (SCSI) adapter that communicates with a hard disk 23 and/or tape storage drive 25 or any other similar component. I/O adapter 27, hard disk 23, and tape storage device 25 are collectively referred to herein as mass storage 24. Operating system 40 for execution on the processing system 400 may be stored in mass storage 24. A network adapter 26 interconnects bus 33 with an outside network 36 enabling data processing system 400 to communicate with other such systems. A screen (e.g., a display monitor) 35 is connected to system bus 33 by display adaptor 32, which may include a graphics adapter to improve the performance of graphics intensive applications and a video controller. In one embodiment, adapters 27, 26, and 32 may be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 all interconnected to bus 33 via user interface adapter 28, which may include, for example, a Super I/O chip integrating multiple device adapters into a single integrated circuit.

In exemplary embodiments, the processing system 400 includes a graphics processing unit 41. Graphics processing unit 41 is a specialized electronic circuit designed to manipulate and alter memory to accelerate the creation of images in a frame buffer intended for output to a display. In general, graphics processing unit 41 is very efficient at manipulating computer graphics and image processing and has a highly parallel structure that makes it more effective than general-purpose CPUs for algorithms where processing of large blocks of data is done in parallel.

Thus, as configured in FIG. 3, the system 400 includes processing capability in the form of processors 21, storage capability including system memory 34 and mass storage 24, input means such as keyboard 29 and mouse 30, and output capability including speaker 31 and display 35. In one embodiment, a portion of system memory 34 and mass storage 24 collectively store an operating system coordinate the functions of the various components shown in FIG. 3.

According to some embodiments, ATE test system 116 and/or DUT 101 may be implemented using some or all aspects of system 400.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
   receiving, by a secondary reload memory on a device-under-test, a plurality of functional exercisers from automated test equipment;
   loading, from the secondary reload memory and into a primary execution memory on the device-under-test, one or more functional exercisers of the plurality of functional exercisers;
   executing, by a processor on the device-under-test, the one or more functional exercisers stored in the primary execution memory, the device-under-test comprising both the primary execution memory and the secondary reload memory; and
   responsive to determining, by the processor based on a test algorithm, that the one or more functional exercisers of the plurality of functional exercisers is to be restarted or reloaded, reloading the one or more functional exercisers from the secondary reload memory into the primary execution memory instead of reloading from the automated test equipment.

2. The computer-implemented method of claim 1, wherein each of the plurality of functional exercisers comprise a set of instructions configured to test a portion of the device-under-test upon execution.

3. The computer-implemented method of claim 1, wherein the plurality of functional exercisers are loaded into the secondary reload memory from an external automated test equipment test system.

4. The computer-implemented method of claim 3, wherein a first data transfer rate associated with loading data from the secondary reload memory into the primary execution memory is greater than a second data transfer rate associated with transferring data from the external automated test equipment test system into the device-under-test.

5. The computer-implemented method of claim 1, wherein at least one functional exerciser of the one or more functional exercisers stored by the primary execution memory is configured to be dynamically and/or conditionally modifiable by the processor based on the test algorithm.

6. The computer-implemented method of claim 5, further comprising modifying the at least one functional exerciser prior to the execution of the at least one functional exerciser.

7. The computer-implemented method of claim 1, wherein executing the one or more functional exercisers stored in the primary execution memory comprises iteratively running the one or more functional exercisers until a pass/fail condition occurs.

8. The computer-implemented method of claim 1, further comprising:
   logging diagnostic and characterization results during execution of the one or more functional exercisers;
   determining, based on the logged diagnostic and characterization results and the test algorithm, adaptive and conditional test sequence decisions; and
   based on the adaptive and conditional test sequence decisions, causing one of:
      a modification of the one or more functional exercisers stored in the primary execution memory; or
      transfer data from the secondary reload memory into the primary execution memory in response to selection of a new condition check point.

9. The computer-implemented method of claim 1, further comprising, responsive to detecting a failure or corruption of the execution of the one or more functional exercisers, reloading the first functional exerciser from the secondary reload memory into the primary execution memory.

10. The computer-implemented method of claim 1, wherein the processor is configured to communicate with an external automated test equipment test system to request start execution, load exercisers, request for test specific environmental changes, results analysis and conditional test execution, or adaptive test support not support by the device-under-test.

11. A system comprising:
   an automated test equipment device;
   a device-under-test communicatively coupled to the automated test equipment device, the device-under-test comprising:
      a processor communicatively coupled to a memory, the memory of the device-under-test comprising both a primary execution memory and a secondary reload memory, the processor configured to execute a method comprising:
         receiving, by the secondary reload memory, a plurality of functional exercisers from the automated test equipment device;
         loading, from the secondary reload memory and into the primary execution memory, one or more functional exercisers of the plurality of functional exercisers;
         executing the one or more functional exercisers stored in the primary execution memory; and
         responsive to determining, based on a test algorithm, that the one or more functional exercisers of the plurality of functional exercisers is to be restarted or reloaded, reloading the one or more functional exercisers of the one or more functional exercisers from the secondary reload memory into the primary execution memory instead of reloading from the automated test equipment device.

12. The system of claim 11, wherein each of the plurality of functional exercisers comprise a set of instructions configured to test a portion of the device-under-test upon execution.

13. The system of claim 11, wherein the plurality of functional exercisers are loaded into the secondary reload memory from the automated test equipment device.

14. The system of claim 11, wherein a first data transfer rate associated with loading data from the secondary reload memory into the primary execution memory is greater than a second data transfer rate associated with transferring data from the automated test equipment device into the device-under-test.

15. The system of claim 11, wherein the at least one functional exerciser of the one or more functional exercisers stored by the primary execution memory is configured to be dynamically and/or conditionally modifiable based on the test algorithm and the method executed by the processor further comprises modifying the at least one functional exerciser prior to the execution of the at least one functional exerciser.

16. The system of claim 11, wherein the method executed by the processor further comprises responsive to detecting a failure or corruption of the execution of the one or more functional exercisers, reloading the one or more functional exercisers from the secondary reload memory into the primary execution memory.

17. A computer program product comprising a non-transitory computer readable storage medium having program instructions embodied therewith the program instructions executable by a computer processor to cause the computer processor to perform a method comprising:

receiving, by a secondary reload memory on a device-under-test, a plurality of functional exercisers from automated test equipment;

loading, from the secondary reload memory and into a primary execution memory on the device-under-test, one or more functional exercisers of the plurality of functional exercisers;

executing, by a processor on the device-under-test, the first functional exerciser stored in the primary execution memory, the device-under-test comprising both the primary execution memory and the secondary reload memory; and responsive to determining, by the processor based on a test algorithm, that the one or more functional exercisers of the plurality of functional exercisers is to be restarted or reloaded, reloading the one or more functional exercisers from the secondary reload memory into the primary execution memory instead of reloading from the automated test equipment.

18. The computer program product of claim 17, wherein each of the plurality of functional exercisers comprise a set of instructions configured to test a portion of the device-under-test upon execution.

19. The computer program product of claim 17, wherein the plurality of functional exercisers are loaded into the secondary reload memory from an external automated test equipment test system.

20. The computer program product of claim 19, wherein a first data transfer rate associated with loading data from the secondary reload memory into the primary execution memory is greater than a second data transfer rate associated with transferring data from the external automated test equipment test system into the device-under-test.

* * * * *